United States Patent [19]

Takahashi et al.

[11] Patent Number: 5,234,155
[45] Date of Patent: Aug. 10, 1993

[54] WIRE BONDING METHOD AND APPARATUS

[75] Inventors: Kuniyuki Takahashi; Minoru Torihata, both of Tokyo, Japan

[73] Assignee: Kabushiki Kaisha Shinkawa, Tokyo, Japan

[21] Appl. No.: 870,461

[22] Filed: Apr. 16, 1992

[30] Foreign Application Priority Data

Apr. 19, 1991 [JP] Japan .................. 3-113825

[51] Int. Cl.⁵ .................. B25B 5/06; H01L 21/60
[52] U.S. Cl. .................. 228/179.1; 228/213; 228/4.5; 269/329
[58] Field of Search .................. 228/4.5, 179, 213; 269/329

[56] References Cited

U.S. PATENT DOCUMENTS 5,037,023 8/1991 Akiyama et al. .................. 228/179

FOREIGN PATENT DOCUMENTS 56-7443 1/1981 Japan .

Primary Examiner—Kenneth J. Ramsey
Attorney, Agent, or Firm—Koda and Androlia

[57] ABSTRACT

In a wire bonding method and apparatus for connecting first and second bonding points by a wire, a wire clamper, that is made up of an immovable member and a movable member which is driven by a linear motor, is used. The linear motor is actuated so that the clamper first acts in a direction of clamping, then the power to the linear motor is switched off or the linear motor is actuated so that the clamper acts in a direction of releasing, and then the linear motor is actuated in the direction that the clamper clamps the wire, thus moving the movable member.

2 Claims, 2 Drawing Sheets

WIRE BONDING METHOD AND APPARATUS

BACKGROUND OF THE INVENTION

1. Field of the Invention

The present invention relates to a wire bonding method and apparatus and more particularly to a wire clamper driving method and apparatus.

2. Prior Art

One of conventionally known wire clampers that clamp bonding wires is comprised of an immovable member and a movable member. The movable member is moved by an electromagnet so that the wire clamper is opened and closed, as described, for example, in Japanese Patent Application Laid-Open No. 56-7443. In such a wire clamper, a certain minimum amount of electric power is required to drive the movable member of the wire clamper. An electric power is also required to keep clamping the bonding wire.

In the above-described prior art the wire is pressed against the immovable member by a movable member that is moved by a predetermined amount of electric power which is necessary to obtain the driving force and the clamping force of the movable member. Therefore, the drawback is that clamping scars are formed on the wire since the movable member strikes the wire before it clamps the wire.

SUMMARY OF THE INVENTION

The object of the present invention is to provide a wire bonding method and apparatus which can prevent clamping scars.

The method of the present invention which achieves the object described above is characterized in that: the method uses a wire clamper which comprises an immovable member and a movable member which is driven by a linear motor, the linear motor is actuated by an electric power so that the movable member is moved in the direction of clamping the wire when the wire clamping process is started, then the linear motor is switched off or actuated in the direction which opens the clamper, and then again the linear motor is actuated in the direction of clamping.

The apparatus of the present invention is characterized in that it comprises: a wire clamper having an immovable member and a movable member for clamping a wire; a linear motor which opens and closes the wire clamper; a linear motor driving circuit which drives the linear motor; and a control circuit which outputs signals at the time of wire clamping so that the linear motor is actuated in the direction of clamping, then switched off or actuated in the direction to open the clamper, and then again actuated in the direction of clamping.

The linear motor is first actuated so that the movable member is moved in the direction of making a clamp of the wire, then the linear motor is switched off or is actuated so as to move the movable member in the opposite direction, thus slowing down the moving speed of the movable member so that the movable member comes into contact with the wire at a low speed.

After the movable member contacts the wire, the linear motor is again actuated in the direction of clamping the wire, so that the movable member clamps the wire by the power caused by the linear motor.

As described above, since the movable member contacts the wire at a low speed, wire scars are prevented. Furthermore, since the movable member clamps the wire as a result of driving force applied after the movable member contacts the wire, an appropriate clamping force is obtained.

DETAILED DESCRIPTION OF THE INVENTION

One embodiment of the present invention will be described below with reference to the drawings.

Figure 3:
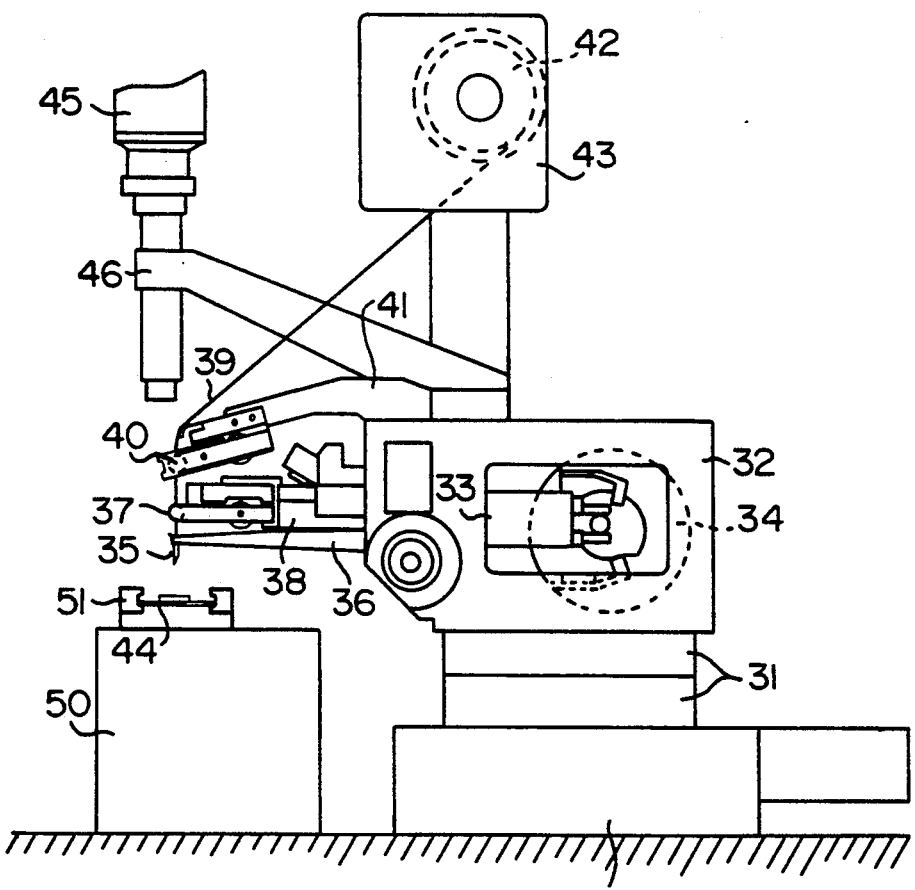
FIG. 3 is a side view of a wire bonding apparatus of the present invention.

FIG. 3 shows a wire bonding apparatus of the present invention.

An X-Y table 31 driven in the X and Y directions is mounted on a stand 30, and a bonding head 32 is fastened to the X-Y table 31. A lifter arm 33 that can be moved in the vertical direction is provided in the bonding head 32, and the lifter arm 33 is raised and lowered by a motor 34.

A tool arm 36 for holding a capillary 35 is fastened to the lifter arm 33, and a clamper support 38 used for holding a wire cutting clamper 37 is also fastened to the lifter arm 33.

Furthermore, another clamper support 41, a spool support 43, and a camera support 46 are provided on the bonding head 32. The clamper support 41 has a wire supporting clamper that supports the wire 39 lightly, the spool support 43 has a spool 42 on which the wire 39 is wound, and the camera support 46 has a camera 45 that detects a sample 44.

The wire 39 that is supplied from the spool 42 to the sample 44 passes through a wire holding clamper 40, the wire cutting clamper 37, and the capillary 35.

In FIG. 3, numeral 50 indicates a feeder which feeds the sample 44, and numeral 51 indicates guide rails which guide the sample 44.

Figure 1:
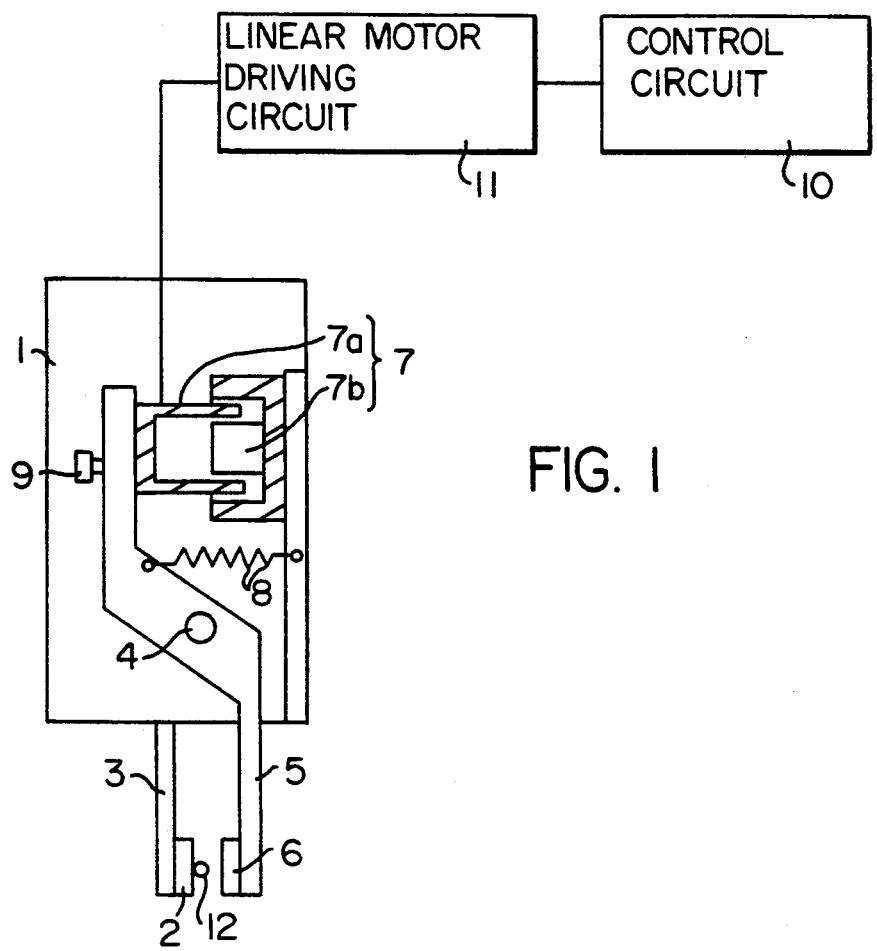
FIG. 1 is a plan view which illustrates one embodiment of the present invention.

The specific structure of the wire cutting clamper 37 will be described with reference to FIG. 1.

The wire cutting clamper 37 is provided on a clamper support 1 (which is referred to by numeral 38 in FIG. 3).

A fixed arm 3 which has an immovable member 2 is fastened to the clamper support 1, and a movable arm 5 is pivotally provided on the clamper support 1 by a supporting shaft 4 so that a movable member 6 faces the immovable member 2.

A linear motor 7 is provided on the clamper support 1 and comprised of a coil side 7a and a core side 7b. The coil side 7a is fastened to one end of the movable arm 5, and the core side 7b of the linear motor 7 is fastened to the clamper support 1. The movable arm 5 is urged by a spring 8 so that the movable member 5 comes into contact with the immovable member 2. The spring 8 has an extremely weak spring force. A stopper 9 which regulates the amount of opening of the movable member 6 is installed on the clamper support 1.

Signals from a control circuit 10 that consists of a microcomputer, etc., are inputted into the linear motor 7 via a linear motor driving circuit 11.

Accordingly, when a plus current or voltage is outputted from the control circuit 10 and applied to the linear motor 7, the coil side 7a of the linear motor 7 is attracted toward the core side 7b. As a result, the movable arm 5 pivots about the supporting shaft 4, and such a pivotal movement causes the movable member 6 to move toward the immovable member 2 so that a wire 12 is clamped between the immovable member 2 and the movable member 6.

When a minus current or voltage is outputted by the control circuit 10 in this state, the coil side 7a of the linear motor 7 is repelled from the core side 7b, so that the movable member 6 is moved back toward the original position. As a result, the wire clamper is opened, and the wire 12 is released.

In this embodiment, a program is stored in the control circuit 10. The program controls a current so as to be outputted from the linear motor driving circuit 11 to the linear motor 7 with a timing as shown in FIG. 2(a).

Figure 2A:
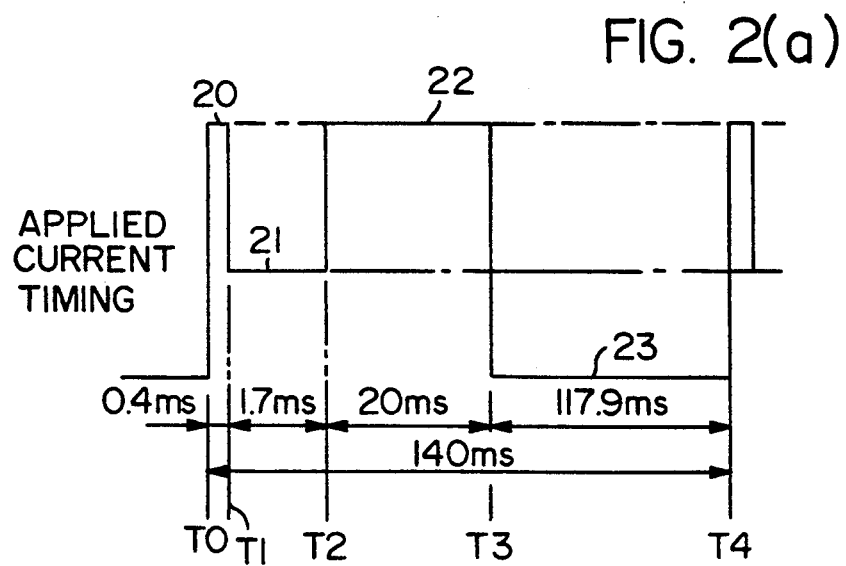
FIG. 2(a) is a chart of the applied current timing used in the present invention.

In FIG. 2(a), a clamper closing action is shown in the interval from T0 to T3, and a clamper opening action is shown in the interval from T3 to T4.

In the clamper closing action, a plus current is applied for T1 seconds (approximately 0.4 ms) as indicated by a numeral 20. Afterward, the current is switched off till T2 (for approximately 1.7 ms) as indicated by numeral 21. Then, a plus current is again applied between T2 and T3 (for approximately 20 ms) as shown by numeral 23.

In accordance with the current that is applied as described above, the clamping action of the wire 12 is accomplished in the following manner:

First, the movable arm 5 is moved so that the movable member 6 provided on the movable arm 5 comes into contact with the immovable member 2 when the plus current is applied to the linear motor 2 as indicated by numeral 20. However, this plus current application 20 is performed for an extremely short period of time; as a result, the movable arm 5 is moved by inertia or by an extremely weak driving force of the spring 8 immediately after the movable arm 5 is driven.

Figure 2B:
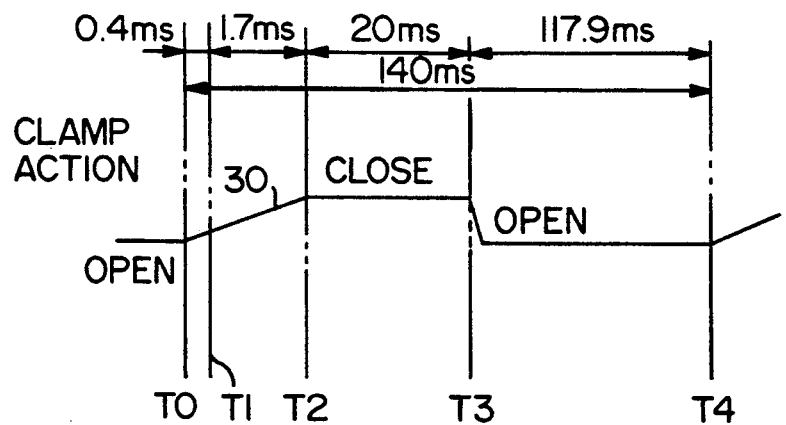
FIG. 2(b) is a diagram of the clamper action in the present invention.

In other words, the movable arm 5 is driven at a low speed as referred to by numeral 30 in FIG. 2(b). Accordingly, the movable member 6 presses the wire 12 against the immovable member 2 at a low speed 30. Thus, wire scars are prevented. Then, as a result of the subsequent application as referred to as numeral 22 of a plus current, the wire 12 is clamped between the fixed arm 3 and movable member 6.

The wire clamping action is performed during, for example, a cutting action of the wire after the completion of bonding to a second bonding point or after a formation of a ball at the tip of bonding wire, etc. Accordingly, the duration of the plus current application 22 is set based upon the time required for cutting the wire 12 or the time required for ball formation at the tip of the wire 12, etc.

When a minus current is applied as referred to by numeral 23 to the linear motor 7 when the wire is clamped between the immovable member 2 and movable member 6, the movable member 6 is caused to move away from the immovable member 2 so that the wire 12 is released.

The times indicated for the plus current application 20 and current switch-off 21 are only the examples. It goes without saying that the present invention is not limited to the values shown in FIG. 2(a).

Furthermore, it would also be of course possible to vary the speed 30 and the clamping force by varying the magnitude of the current applied. Moreover, the embodiment is described in terms of a current application; however, since current and voltage are in a fixed relationship, it would also be possible to describe the embodiment in terms of voltage application.

In addition, the embodiment is described in terms of a current switch-off 21; however, it would also be possible to apply a minus current in this action instead of switching the current off.

In the above embodiment, moreover, the coil side 7a of the linear motor 7 is fastened to the movable arm 5, and the core side 7b is fastened to the clamper support 1. However, the coil side 7a can be fastened to the clamper support 1, and the core side 7b to the movable arm 5.

In case where the linear motor 7 is actuated at 20 in the direction of clamping, after which the power is switched off at 21 or the linear motor 7 is actuated in the direction which opens the clamper, the movable member 6 is first moved by the actuation of the linear motor 7 in the direction of clamping, after which the driving force of the movable member 6 is weakened by switching off the power or actuating the linear motor 7 in the direction which opens the clamper, so that the movable member 6 strikes the wire 12 gently.

When the linear motor 7 is again actuated at 23 in the direction of clamping, the movable member 6 clamps the wire 12 as a result of this driving force. In other words, since the movable member 6 strikes the wire 12 at a low speed, wire scars are prevented. Furthermore, since the movable member 6 clamps the wire 12 as a result of a driving force applied after the movable member 6 has contacted the wire 12, an appropriate clamping force is obtainable.

In the present invention, the linear motor is actuated so that the movable member is moved toward the immovable member, immediately after the linear motor is actuated, a switching off of the power or an actuation of the linear motor so that the movable member is moved toward the original position is performed, then after the movable member is contacted to the wire, the linear motor is actuated so that the movable member is moved in the direction of clamping. Thus, the movable member contacts the wire lightly and holds the wire securely, so that wire scars are prevented, and the wire is clamped with an appropriate clamping force.

We claim:

1. A wire bonding method for connecting a first bonding point and a second bonding point by a wire with the use of a wire clamper comprising an immovable member and a movable member which is driven by a linear motor, comprising the steps of:

actuating said linear motor in a direction of clamping at a time of wire clamping;

slowing said movable member just before said movable member contacts said wire by switching off said linear motor or actuating said linear motor in a direction which opens said clamper so that said movable member contacts said wire at a low speed; and completing clamping of said wire by again actuating said linear motor in a direction of clamping;

whereby wire scars caused by clamping are prevented.

2. A wire bonding apparatus for connecting a first bonding point and a second bonding point by a wire comprising:

a wire clamper having an immovable member and a movable member;

a linear motor which moves said movable member of said wire clamper;

a linear motor driving circuit which drives said linear motor; and a control circuit which outputs signals at a time of wire clamping so that said linear motor is first actuated in a direction of clamping, then switched off or actuated in a direction which opens said clamper to slow said movable member just before said movable member contacts said wire so that said movable member contacts said wire at a low speed, and then again actuated in a direction of clamping to complete clamping of said wire;

whereby wire scars caused by clamping are prevented.

* * * * *